United States Patent [19]

Uehara et al.

[11] Patent Number: 4,498,762
[45] Date of Patent: Feb. 12, 1985

[54] PROJECTION TYPE EXPOSURE APPARATUS

[75] Inventors: Makoto Uehara, Tokyo; Satoru Anzai, Zama, both of Japan

[73] Assignee: Nippon Kogaku K.K., Tokyo, Japan

[21] Appl. No.: 451,394

[22] Filed: Dec. 20, 1982

[30] Foreign Application Priority Data

Dec. 25, 1981 [JP] Japan .................................. 56-214795

[51] Int. Cl.³ .............................................. G03B 27/52
[52] U.S. Cl. .................................. 355/55; 350/162.16; 355/61; 356/401
[58] Field of Search ........................................ 355/43–45, 355/55, 61, 77; 350/162.16; 356/400, 401, 123

[56] References Cited

U.S. PATENT DOCUMENTS

| 4,037,969 | 7/1977 | Feldman et al. | 356/401 |
| 4,326,805 | 4/1982 | Feldman et al. | 356/401 X |
| 4,395,117 | 7/1983 | Suzuki | 355/45 X |

Primary Examiner—Richard A. Wintercorn
Attorney, Agent, or Firm—Shapiro and Shapiro

[57] ABSTRACT

A projection type exposure apparatus has a projection objective lens, a projection negative having a predetermined shape pattern and an alignment mark, and a photosensitive plate having an alignment mark. The shape pattern of the projection negative is projected upon the photosensitive plate by the projection objective lens. Main illuminating optical means illuminates the projection negative with a first wavelength light to which the photosensitive plate is sensitive, and alignment optical means illuminates the projection negative with a second wavelength light to which the photosensitive plate is insensitive. The positional relation between the projection negative and the photosensitive plate is detected using the second wavelength light through the projection objective lens. One of the alignment mark on the projection negative and the alignment mark on the photosensitive plate has a zone pattern which forms a light-condensing point at a position spaced apart by a predetermined amount from the surface on which said one mark is formed, and said predetermined amount corresponds to the amount of chromatic aberration of the projection objective lens, at the side thereof adjacent to said zone pattern, for the second wavelength light relative to the first wavelength light.

10 Claims, 7 Drawing Figures

FIG. 3
FIG. 4
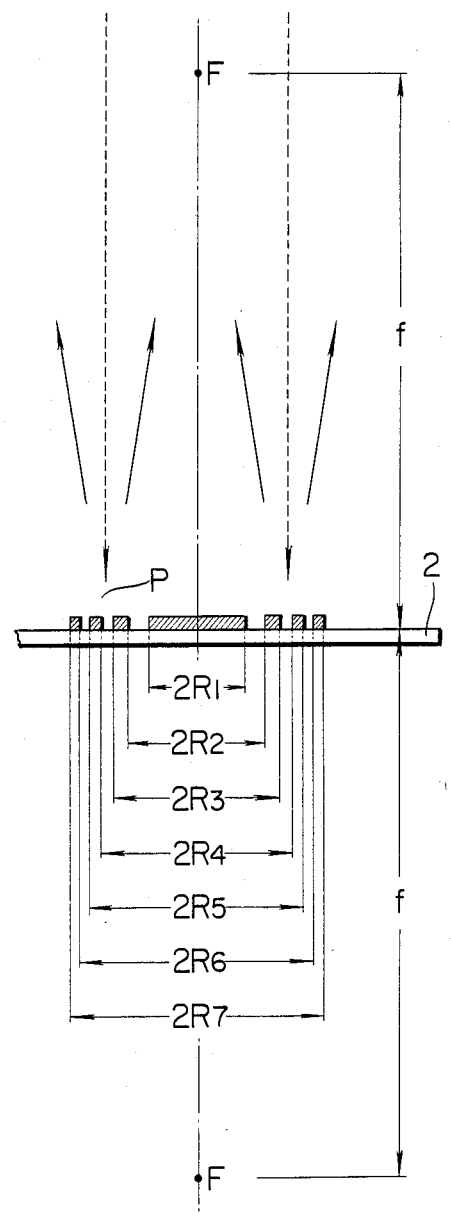
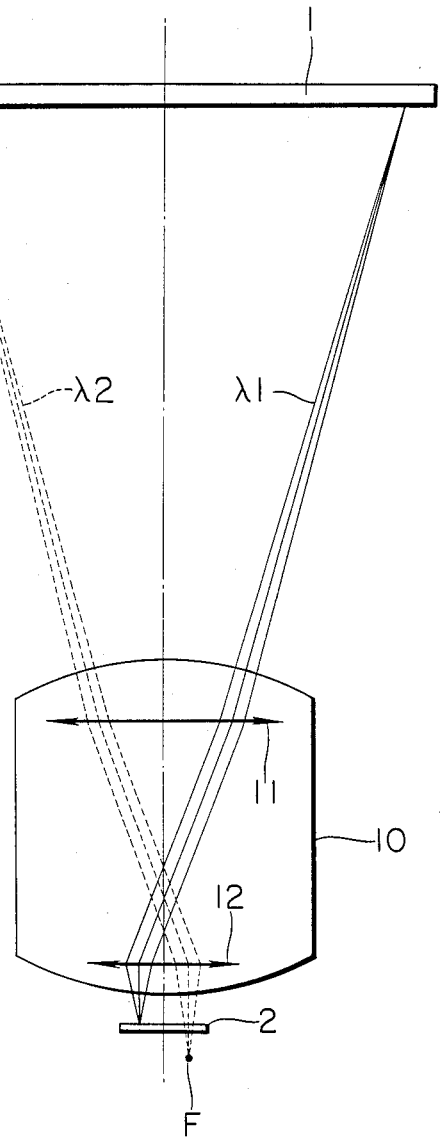

PROJECTION TYPE EXPOSURE APPARATUS

BACKGROUND OF THE INVENTION

1. Field of the Invention

This invention relates to a projection type exposure apparatus used for the manufacture of integrated circuits, and particularly to an alignment apparatus thereof and an alignment method.

2. Description of the Prior Art

Generally, the process of making integrated circuits such as IC, LSI, etc. basically comprises the steps of resist application→alignment→exposure→development→etching repeated a plurality of times. The alignment mentioned hereinabove is a confirmation work for accurately maintaining a predetermined positional relation, during each exposure, relative to a pattern formed during the preceding exposure, and as the degree of integration of circuits becomes higher, the exposure pattern becomes finer and more accurate alignment is required.

An alignment method called the TTL alignment is known in which images of alignment marks on a reticle and a wafer formed through a projection objective lens by light of the same wavelength as the exposure light are observed in overlapped relationship. This alignment method, however, has a disadvantage that the resist on the wafer is exposed during alignment, and this has led to the necessity of limiting the exposed area as by a stop so that only the alignment marks are exposed during alignment. Also, if the alignment marks are exposed, the alignment marks disappear due to development in the case of a positive type resist, and this has given rise to various problems including the necessity of moving the alignment marks to the unexposed area each time.

An apparatus in which alignment is effected by the use of light of a wavelength different from the exposure wavelength has also been proposed. In the case of such apparatus, alignment light does not sensitize the photoresist and the above-mentioned problems do not occur. However, it is very difficult to completely aberration-correct the projection objective lens for both of the exposure wavelength and the wavelength of the alignment light, and it is difficult because of so-called chromatic aberration to maintain the accuracy of alignment high. Also, the apparatus has become complicated and has not been sufficiently satisfactory.

SUMMARY OF THE INVENTION

It is an object of the present invention to provide a projection type exposure apparatus and method in which alignment is effected by the use of light of a wavelength different from the exposure wavelength and which can maintain excellent alignment accuracy by a simple construction in spite of the chromatic aberration of the projection objective lens.

The present invention provides a projection type exposure apparatus in which a pattern on a reticle is projected upon a wafer by a projection objective lens with a first wavelength light and alignment of the reticle (as a projection negative) and the wafer (as a photosensitive plate) is effected through the projection objective lens by a second wavelength light different from the first wavelength light. The apparatus is provided with an illuminating optical system for forming a Fresnel zone pattern on the wafer so that the distance between the wafer and the image formed by the Fresnel zone pattern using the second wavelength light is in accord with the amount of longitudinal chromatic aberration of the projection objective lens for the second wavelength light relative to the first wavelength light. An observation optical system is provided for enabling the focused image of the Fresnel zone pattern projected upon the reticle by the projection objective lens and a predetermined alignment mark on the reticle to be observed by the use of the second wavelength light.

The invention will become more fully apparent from the following detailed description of an embodiment thereof taken in conjunction with the accompanying drawings.

BRIEF DESCRIPTION OF THE DRAWINGS

FIG. 3 is a cross-sectional view of the Fresnel zone pattern.

FIG. 4 is an optical path diagram showing the conjugate relation with respect to the projection objective lens.

DESCRIPTION OF THE PREFERRED EMBODIMENT

Figure 1:
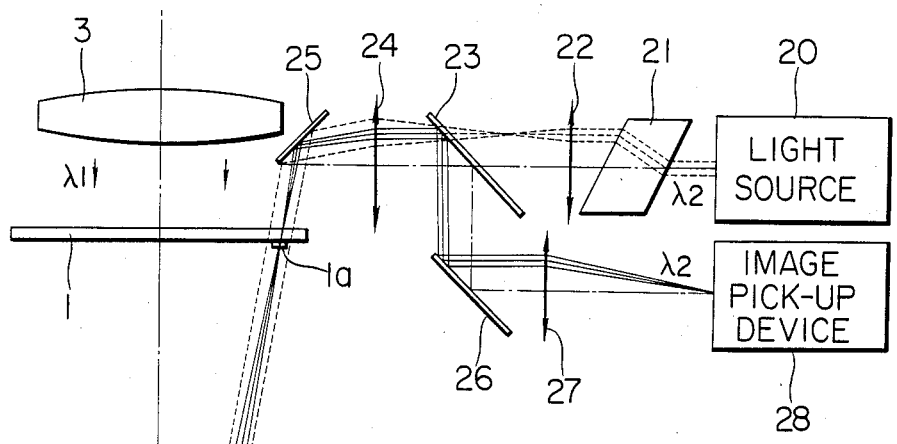
FIG. 1 is a schematic optical path diagram of an alignment optical system according to an embodiment of the present invention.
Figure 1:
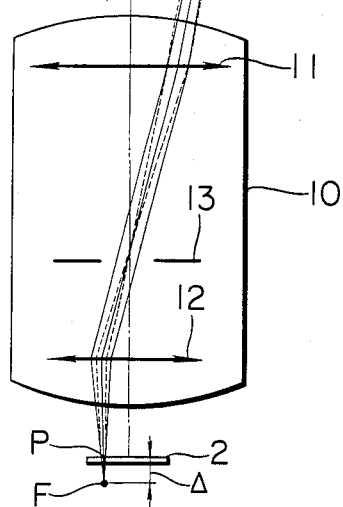
Figure 2:
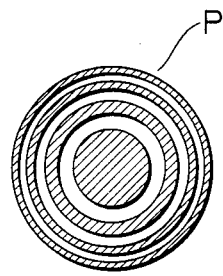
FIG. 2 is a plan view showing an example of the Fresnel zone pattern formed on a wafer.

FIG. 1 is a schematic optical path diagram of the alignment optical system of the apparatus according to the present invention. A reticle 1 as the negative of an exposure pattern is uniformly illuminated by light of short wavelength, for example, g-line ($\lambda_1 = 435.8$ nm) supplied by an exposure illuminating optical system 3, and a pattern on the reticle 1 is projected upon a wafer 2 by a projection objective lens 10. Thereby the resist applied to the wafer 2 is sensitized and the printing exposure of the pattern on the reticle 1 is effected. The printing exposure is carried out with the reticle replaced by a new one each time the aforementioned process is repeated. During the first printing exposure, a Fresnel zone pattern P which is in the form of concentric circles as shown in the plan view of FIG. 2 is formed on the wafer 2 by light $\lambda_1$. Then light of a wavelength range to which the resist is insensitive, for example, light of relatively long wavelength from a light source 20 such as a He-Ne laser ($\lambda_2 = 632.8$ nm), is directed toward the Fresnel zone pattern P through the projection objective lens 10. The light beam from the light source 20 is shifted by a deflecting prism 21, is condensed by a condenser lens 22, passes through a half-mirror 23, passes through the reticle 1 by means of a first objective lens 24 and a mirror 25, is condensed at the entrance pupil of the projection objective lens 10 for wavelength $\lambda_2$ and telecentrically illuminates the Fresnel zone pattern P on the wafer 2. The deflecting prism 21 is for disposing the light source 20 on the optical axis of the condenser lens 22 and is not indispensable. The light $\lambda_2$ from the light source 20 supplied to the projection objective lens 10 is condensed at the position of an imaginary stop 13 for wavelength $\lambda_2$ by the converging action of a first lens group 11 in the projection objective lens 10, is made into a telecentric parallel light beam by a second lens group 12 and exits toward the wafer 2. The Fresnel zone pattern P forms a focused image F at a position spaced apart by a distance $\Delta$ from the wafer 2, as will hereinafter be described, and the focused image F is projected upon the reticle 1 by the projection objective lens 10. The focused image F actually is a virtual light-condensing point and since the wafer 2 is reflective, the focused image F is formed as if it were formed beneath the wafer 2 as shown in FIG. 1. A predetermined alignment mark $1a$ is provided on the reticle 1, and the image of the focused image F and the image of the alignment mark $1a$ on the reticle 1 are formed on the image pick-up surface of an image pick-up device 28 such as ITV by means of the first objective lens 24, half-mirror 23, a mirror 26 and a second objective lens 27. In FIG. 1, the illuminating light of wavelength $\lambda_2$ used for alignment is indicated by dotted lines and the observation light is indicated by solid lines.

The Fresnel zone pattern P shown in the plan view of FIG. 2 comprises annular convex portions and concave portions alternately formed by concentric circles of radii $R_1, R_2, R_3, \ldots$ as shown in the cross-sectional view of FIG. 3. The Fresnel zone pattern, known as a Fresnel zone plate, has an action equivalent to that of a lens due to a diffraction phenomenon, and when the focal length for light of wavelength $\lambda$ is f, the radius Rn (n=1, 2, 3, . . . ) of each concentric circle is determined by $Rn = \sqrt{nf\lambda}$. The Fresnel zone plate is explained, for example, in E. Hecht and A. Zajac, Optics, P. 375, Addison-Wesley Publishing Company, Inc. In the present embodiment, the Fresnel zone pattern P is illuminated by a parallel light beam and therefore, the distance $\Delta$ between the focused image F and the wafer 2 is in accord with the focal length f. The light beam applied to the Fresnel zone pattern need not always be a parallel light beam but may be a convergent or divergent light beam, and also in the latter case, the Fresnel zone pattern can be handled equally with a usual lens and the position of the focused image changes in accordance with the state of the light beam applied. In the ensuing description, it is to be understood that illuminating light which is a parallel light beam is applied. It is also known that the focused image by the Fresnel zone pattern is formed at two places by +1st order and −1st order diffracted light. Of course, the Fresnel zone pattern is not restricted to the aforementioned concavo-convex pattern but may be a light-and-dark pattern that produces a similar effect.

Now, in such a construction, the distance $\Delta$ (=f) between the image F formed by the Fresnel zone pattern P and the wafer 2 is in accord with the amount of longitudinal chromatic aberration of the projection objective lens 10 for the alignment illuminating light $\lambda_2$ relative to the exposure light $\lambda_1$. As shown in FIG. 4, for to the exposure light $\lambda_1$, the reticle 1 and the wafer 2 are conjugate with each other and at the same time, the reticle 1 and the image F formed by the Fresnel zone pattern P are also conjugate with each other. Accordingly, alignment of high accuracy can be accomplished by means of light $\lambda_2$ of a different wavelength from the exposure light $\lambda_1$ in spite of the chromatic aberration of the projection objective lens.

Figure 5:
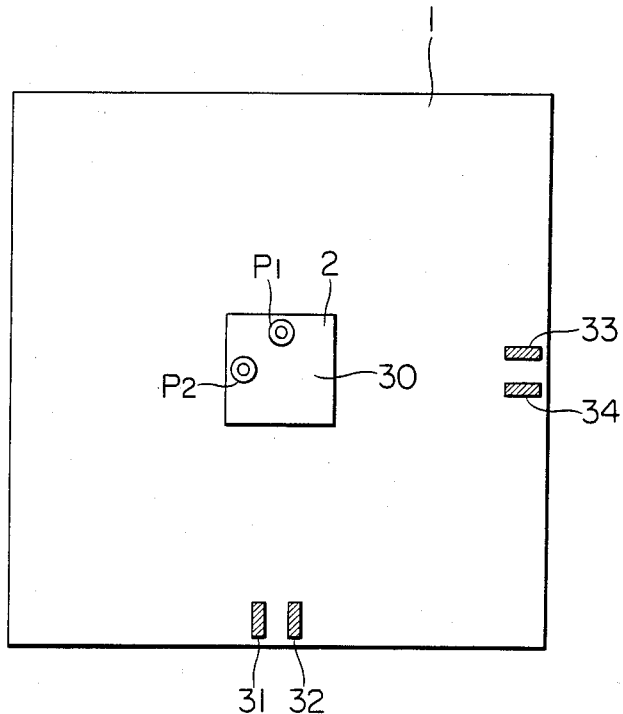
FIG. 5 is a plan view showing a reticle and wafer in overlapped relationship.

FIG. 5 schematically shows plan views of the reticle and wafer in overlapped relationship to illustrate the positional relation between alignment marks 31, 32, 33, 34 provided on the reticle 1 and Fresnel zone patterns $P_1$, $P_2$ provided on the wafer 2. In the marginal portion of the reticle 1, two pairs of linear alignment marks 31, 32 and 33, 34 are provided at positions orthogonal to each other with respect to the central point 30 of the reticle, i.e., the optical axis position of the projection objective lens, and correspondingly to these, two Fresnel zone patterns $P_1$ and $P_2$ are provided on the wafer 2 at positions also orthogonal to each other with respect to the central point 30. The two pairs of alignment marks on the reticle 1 may be positioned at any place other than on the same straight line passing through the central point 30, but it is desirable to provide these alignment marks at positions orthogonal to each other because it can minimize the alignment error.

Figure 6:
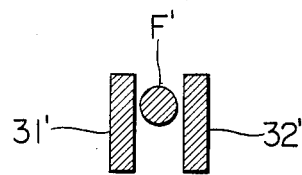
FIG. 6 is a view field representation showing an example of the image observed by means of the alignment optical system.

As shown in FIG. 4, the reticle 1 and the wafer 2 are conjugate with each other for the exposure light $\lambda_1$ and therefore, during the first exposure of the wafer, the two Fresnel zone patterns $P_1$ and $P_2$ are formed on the wafer 2 by projection of the Fresnel zone pattern formed on a first reticle for exposure, not shown. During each exposure thereafter, alignment is repeated by the use of illuminating light of wavelength $\lambda_2$ and with the aid of the focused images of the Fresnel zone patterns $P_1$, $P_2$ and the alignment marks 31–34 on the reticle. That is, if, as shown in FIG. 6, the image F' formed of the focused image F by the Fresnel zone pattern $P_1$ is positioned intermediately of the images 31' and 32' of the pair of linear alignment marks 31 and 32 formed on the reticle 1 in the observation view field of the image pick-up device 28, lateral aligning is done as viewed in FIG. 5. Likewise, if the focused image formed by the Fresnel pattern $P_2$ is positioned intermediately of the alignment marks 33 and 34 on the reticle, longitudinal aligning is done, and by the aligning at these two places, alignment of the reticle 1 and the exposed area of the wafer 2 is achieved.

A predetermined shape pattern and a zone pattern to be reduction-projected upon the wafer are formed on the reticle used for the first exposure. The zone pattern on this reticle can form a predetermined focused image with the alignment illuminating light $\lambda_2$ and the focal length thereof is equal to the amount of longitudinal chromatic aberration of the projection objective lens at the side thereof adjacent to the reticle, for alignment illuminating light $\lambda_2$ relative to the exposure light $\lambda_1$.

Figure 7:
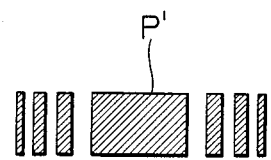
FIG. 7 is a plan view showing another example of the Fresnel zone pattern.

Although, in the above-described embodiment, the Fresnel zone pattern P provided on the wafer is in the form of concentric circles as shown in FIG. 2, this is not restrictive and the Fresnel zone pattern P may be a linear Fresnel zone pattern P' as shown in the plan view of FIG. 7. In this case, the focused image is in the form of a straight line and, by putting it between the pair of linear alignment marks on the reticle, precise alignment can likewise be accomplished.

In the above-described reduction projection type exposure apparatus, integrated circuits are manufactured in the following manner. During the first exposure, the predetermined shape pattern and zone pattern on a first reticle are projected upon the wafer by the projection objective lens with exposure light $\lambda_1$. By development and etching, the shape pattern and zone pattern on the first reticle are formed on the wafer. Before the second exposure, the first reticle is replaced by a second reticle having a shape pattern different from the shape pattern of the first reticle. Illuminating light $\lambda_2$ for alignment is supplied to the alignment mark on the second reticle, and to the zone pattern formed on the wafer through the projection objective lens. At this time, by virtue of the zone pattern on the wafer, the light-condensing point of the illuminating light $\lambda_2$ is formed at the focal length position equal to the amount of chromatic aberration on that side of the projection objective lens which is adjacent to the wafer. Accordingly, the image of the light-condensing point formed by the zone pattern on the wafer is projected upon the second reticle by the projection objective lens, and the positions of the alignment mark on the second reticle and the image of the light-condensing point formed by the zone pattern can be observed or detected by means of the alignment optical system. Thereupon, the second reticle and the wafer are moved relative to each other so that the alignment mark on the second reticle and the image of the light-condensing point are in a predetermined positional relation, whereby accurate alignment of the second reticle and the wafer is accomplished. Immediately thereafter, the shape pattern on the second reticle is projected on the wafer by exposure light $\lambda_1$. The wafer is again subjected to development and etching and as a result, the shape patterns of the first and second reticles are reduction-formed in overlapped relationship on the wafer.

Thereafter, by the use of a third, a fourth, reticle, as in the case of the second reticle, a number of shape patterns are formed in overlapped relationship on the wafer, whereby an integrated circuit is manufactured. Of course, in the reduction projection type exposure apparatus, the projection exposure by a reticle is repetitively effected on a wafer a plurality of times, for example, several tens of times, and a number of integrated circuits are produced on a wafer.

In the apparatus of the present invention as described above, alignment is possible due to light of wavelength range other than the wavelength range sensitive to the resist and therefore, it is not necessary to clearly distinguish the printing exposure area from the area used for alignment. Also, as long as the Fresnel zone pattern is not exposed during each time of exposure, alignment can be accomplished by the focused image thereby each time. Moreover, since the apparatus is designed such that the focused image of the Fresnel zone pattern is displaced from the wafer by the amount of chromatic aberration of the projection objective lens, that is, since a Fresnel zone pattern having a focal length corresponding to the amount of chromatic aberration is formed in the embodiment, alignment can be effected with the focused image formed by the Fresnel zone pattern as the alignment mark of the wafer. Accordingly, the apparatus can be handled as if use were made of a projection objective lens corrected in aberration for both the wavelength of the exposure light and the wavelength of the alignment light. Therefore, it is possible to obtain an excellent aligning accuracy substantially equal to that in a case where the so-called TTL alignment through the projection objective lens is effected with light of the same wavelength as the exposure wavelength, and the effect is particularly remarkable in a reduction projection type exposure apparatus of which alignment of higher accuracy is required. Further, a light source of very high intensity and of long wavelength range such as a He-Ne laser can be used as the alignment light, and this leads to the ability to obtain an alignment signal of high SN ratio and is very effective for auto-alignment.

We claim:

1. A projection type exposure apparatus having a projection objective lens, a projection negative having a predetermined shape pattern and an alignment mark, a photosensitive plate having an alignment mark, the shape pattern of said projection negative being projected upon said photosensitive plate by said projection objective lens, main illuminating optical means for illuminating said projection negative with a first wavelength light to which said photosensitive plate is sensitive, and alignment optical means for illuminating said projection negative with a second wavelength light to which said photosensitive plate is insensitive and for detecting the positional relation between said projection negative and said photosensitive plate by said second wavelength light through said projection objective lens, characterized in that one of the alignment mark on said projection negative and the alignment mark on said photosensitive plate has a zone pattern which forms a light-condensing point at a position spaced apart by a predetermined amount from the surface on which said one mark is formed, and said predetermined amount corresponds to the amount of chromatic aberration of said projection objective lens, at the side thereof adjacent to said zone pattern, for said second wavelength light relative to said first wavelength light.

2. The apparatus according to claim 1, wherein said projection objective lens reduction-projects the shape pattern of said projection negative onto said photosensitive plate.

3. The apparatus according to claim 2, wherein the alignment mark on said photosensitive plate has said zone pattern.

4. The apparatus according to claim 3, wherein said alignment optical means illuminates the zone pattern on said photosensitive plate with a parallel beam of the second wavelength light through said projection objective lens, and the amount of separation of said light-condensing point from said plate is equal to the focal length of said zone pattern for the second wavelength light.

5. The apparatus according to claim 4, wherein said zone pattern is a circular zone pattern.

6. The apparatus according to claim 4, wherein said zone pattern is a linear zone pattern.

7. A photosensitive member on which a predetermined shape pattern is printed and exposed by exposure light through a projection objective lens and in which alignment is done by light of a wavelength different from that of said exposure light, said photosensitive member having a zone pattern forming a predetermined light-condensing point by light applied thereto, the distance of said light-condensing point from said zone pattern corresponding to the amount of longitudinal chromatic aberration of said projection objective lens, at the side thereof adjacent to said photosensitive member, for said alignment light relative to said exposure light.

8. The photosensitive member according to claim 7, wherein the focal length of said zone pattern for said alignment light is equal to said amount of chromatic aberration.

9. A projection negative having a predetermined shape pattern and in which said predetermined shape pattern is printed and exposed on a photosensitive member by exposure light through a projection objective lens and alignment is effected by light of a wavelength different from that of said exposure light, said projection negative having a zone pattern forming a predetermined light-condensing point by light applied thereto, the distance of said light-condensing point from said zone pattern corresponding to the amount of longitudinal chromatic aberration of said projection objective lens, at the side thereof adjacent to the projection negative, for said alignment light relative to said exposure light.

10. The projection negative according to claim 9, wherein the focal length of said zone pattern for said alignment light is equal to said amount of chromatic aberration.

* * * * *